(12) United States Patent
Lee

(10) Patent No.: US 11,315,857 B2
(45) Date of Patent: Apr. 26, 2022

(54) PACKAGE STRUCTURES

(71) Applicant: Delta Electronics, Inc., Taoyuan (TW)

(72) Inventor: Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 14 days.

(21) Appl. No.: 17/081,546

(22) Filed: Oct. 27, 2020

(65) Prior Publication Data

US 2021/0249338 A1 Aug. 12, 2021

Related U.S. Application Data

(63) Continuation-in-part of application No. 16/786,139, filed on Feb. 10, 2020.

(51) Int. Cl.
*H01L 23/495* (2006.01)

(52) U.S. Cl.
CPC .... *H01L 23/49541* (2013.01); *H01L 23/4951* (2013.01); *H01L 23/4952* (2013.01); *H01L 23/49586* (2013.01)

(58) Field of Classification Search
CPC ............. H01L 23/4951; H01L 23/3114; H01L 23/49548; H01L 23/49541; H01L 23/4952; H01L 23/49586
USPC ................................................ 257/666, 673
See application file for complete search history.

(56) References Cited

U.S. PATENT DOCUMENTS

| | | | | |
|---|---|---|---|---|
| 5,016,082 A | * | 5/1991 | Roth | ................. H01L 23/49572 257/668 |
| 5,654,585 A | | 8/1997 | Nishikawa | |
| 5,677,567 A | * | 10/1997 | Ma | .................... H01L 23/49537 257/666 |
| 5,731,631 A | * | 3/1998 | Yama | ..................... H01L 24/86 257/702 |
| 2008/0035959 A1 | | 2/2008 | Jiang | |

(Continued)

FOREIGN PATENT DOCUMENTS

| | | |
|---|---|---|
| CN | 101202266 B | 8/2012 |
| CN | 101131986 B | 1/2013 |

OTHER PUBLICATIONS

Office Action dated Nov. 12, 2020 in TW Application No. 109123283, 7pages.

(Continued)

*Primary Examiner* — Nitin Parekh
(74) *Attorney, Agent, or Firm* — Muncy, Geissler, Olds & Lowe, P.C.

(57) ABSTRACT

A package structure is provided. The package structure includes a leadframe including a first portion and a second portion. The first portion includes a first base part and a plurality of first extended parts connected to the first base part. The second portion includes a second base part and a plurality of second extended parts connected to the second base part. The first extended parts and the second extended parts are arranged in such a way that they alternate with each other. In the package structure, a chip is disposed on a part of the first extended parts of the first portion and the second extended parts of the second portion of the leadframe. The package structure further includes a plurality of protrusions, opposite to the chip, disposed on the first extended parts and the second extended parts.

20 Claims, 8 Drawing Sheets

(56) References Cited

U.S. PATENT DOCUMENTS

| | | | | |
|---|---|---|---|---|
| 2008/0048218 A1* | 2/2008 | Jiang | ................. | H01L 23/49562 |
| | | | | 257/288 |
| 2010/0164078 A1 | 7/2010 | Madrid et al. | | |
| 2012/0001306 A1* | 1/2012 | Wang | ................. | H01L 21/4832 |
| | | | | 257/666 |
| 2013/0127029 A1* | 5/2013 | Lee | ................. | H01L 23/49551 |
| | | | | 257/675 |
| 2016/0247748 A1* | 8/2016 | Kinzer | .............. | H01L 23/49568 |

OTHER PUBLICATIONS

Extended European Search Report dated Sep. 22, 2020 in EP Application No. 20159326.6, 8 pages.
Office Action dated Jul. 8, 2021 in U.S. Appl. No. 16/786,139, 14 pages.

* cited by examiner

PACKAGE STRUCTURES

CROSS REFERENCE TO RELATED APPLICATIONS

This application is a Continuation-In-Part of pending U.S. patent application Ser. No. 16/786,139, filed Feb. 10, 2020 and entitled "PACKAGE STRUCTURES".

TECHNICAL FIELD

The invention relates to a package structure, and more particularly to a package structure a comb-like leadframe.

BACKGROUND

In a planar power component, a metal structure in the chip is required for collecting current, and then solder balls or wires lead the current to a leadframe or a substrate.

However, the turn-on time can be put out of synchronization by the metal structure in the chip being too thin, by the current that can be carried being limited, and by there being a voltage difference on the metal structure.

Therefore, development of a package structure capable of achieving uniform and stable current density and voltage during operation of the component is desirable.

SUMMARY

In accordance with one embodiment of the invention, a package structure is provided. The package structure includes a leadframe including a first portion and a second portion opposite to the first portion. The first portion includes a first base part and a plurality of first extended parts connected to the first base part. The second portion includes a second base part and a plurality of second extended parts connected to the second base part. The first extended parts and the second extended parts are arranged in such a way that they alternate with each other. In the package structure, a chip is disposed on a part of the first extended parts of the first portion and the second extended parts of the second portion of the leadframe. The package structure further includes a plurality of protrusions, opposite to the chip, disposed on the first extended parts and the second extended parts. Each of the first extended parts and the second extended parts has at least one protrusion disposed thereon.

In some embodiments, the leadframe is made of metal. In some embodiments, the first portion and the second portion are comb-like structures. In some embodiments, the first extended parts of the first portion extend towards the second base part of the second portion, and the second extended parts of the second portion extend towards the first base part of the first portion. In some embodiments, the first extended parts of the first portion and the second extended parts of the second portion are coplanar.

In some embodiments, there is a first distance between the first extended part of the first portion and the second base part of the second portion. In some embodiments, there is a second distance between the first base part of the first portion and the second base part of the second portion. In some embodiments, the second distance is greater than or equal to three times the first distance. In some embodiments, the first distance is in a range from 100 µm to 500 µm.

In some embodiments, the first extended part of the first portion and the second extended part of the second portion have a first thickness. In some embodiments, the first base part of the first portion and the second base part of the second portion have a second thickness. In some embodiments, the second thickness is greater than or equal to two times the first thickness. In some embodiments, the difference between the second thickness and the first thickness is greater than or equal to 100 µm. In some embodiments, the second thickness is in a range from 200 µm to 400 µm.

In some embodiments, the first extended part of the first portion has a bottom portion connected to the first base part and a top portion towards the second base part of the second portion, and the first extended part has a width which decreases gradually from the bottom portion to the top portion of the first extended part. In some embodiments, the first extended part of the first portion has a length and an average width, and the length is greater than or equal to three times the average width.

In some embodiments, the chip is disposed on a part of the first extended parts of the first portion and the second extended parts of the second portion via solder balls. In some embodiments, the chip is disposed on a part of the first extended parts of the first portion and the second extended parts of the second portion via copper pillars. In some embodiments, the chip is disposed on a part of the first extended parts of the first portion and the second extended parts of the second portion via solder paste, silver paste or a solder bar.

In some embodiments, a part of the first base part of the first portion further extends towards the second base part of the second portion to a position which is under a part of the first extended part of the first portion. In some embodiments, there is a third distance between the first base part of the first portion and the second base part of the second portion. In some embodiments, the third distance is greater than or equal to three times the first distance.

In some embodiments, the package structure further includes an encapsulation material covering the chip and a part of the leadframe, exposing sidewalls and bottoms of the first base part of the first portion and the second base part of the second portion of the leadframe.

In some embodiments, the protrusions are made of metal or insulating material. In some embodiments, the protrusions, the first base part and the second base part are coplanar and exposed from the encapsulation material. In some embodiments, the package structure further includes an insulating material layer covering the protrusions, when the protrusions are made of metal. In some embodiments, the package structure further includes an insulating material layer covering the protrusions, when the protrusions are made of metal, wherein the protrusions and the insulating material layer are buried in the encapsulation material.

In accordance with one embodiment of the invention, a package structure is provided. The package structure includes a leadframe including a first portion and a second portion opposite to the first portion. The first portion includes a first base part and a plurality of first extended parts connected to the first base part. The second portion includes a second base part and a plurality of second extended parts connected to the second base part. The first extended parts and the second extended parts are arranged in such a way that they alternate with each other. The first extended parts and the second extended parts have a first thickness. The first base part and the second base part have a second thickness. The second thickness is the same as the first thickness. In the package structure, a chip is disposed on a part of the first extended parts of the first portion and the second extended parts of the second portion of the leadframe.

In some embodiments, the package structure further includes an encapsulation material covering the chip and a part of the leadframe, exposing sidewalls and bottoms of the first base part of the first portion and the second base part of the second portion and bottoms of the first extended parts of the first portion and the second extended parts of the second portion of the leadframe. In some embodiments, the first extended parts, the first base part, the second extended parts and the second base part are coplanar and exposed from the encapsulation material. In some embodiments, the package structure further includes an insulating material layer covering the exposed first extended parts and second extended parts.

In the present invention, a package structure with a specific comb-like leadframe is provided. Some appropriate dimensions and structure configurations of the leadframe are considered. For example, the distance between the first base part and the second base part is greater than or equal to about three times the distance between the first extended part and the second base part, or the thickness of the base part is greater than or equal to about two times the thickness of the extended part, or the extended part has the shape of trapezoid. When the distance between the first extended part and the second base part is less than 100 μm, the insulation distance is insufficient. When the distance between the first extended part and the second base part is greater than 500 μm, the size of the chip will exceed the range of the extended part, affecting the current conduction. When the thickness of the extended part is too thick, there is a risk of exposing the extended parts from the encapsulation material. In addition, the trapezoidal extended part improves the uniformity of the current conduction. When current is collected along the chip, it is no longer conducted only through the metal structure in the chip, but is the "extended part" combined with the metal structure. The total cross-sectional area for current conduction is increased by disposing the chip on the extended parts protruding from the base part of the comb-like leadframe which further increases the carrying current. The increase of the cross-sectional area also reduces the resistance value simultaneously, so that when the current flows through it, the voltage difference generated is reduced, achieving uniform and stable current density and voltage during component operation.

In the present invention, the extended parts of the leadframe are further supported by the protrusions made of metal or insulating material, which can avoid deformation and bending of the extended parts during the packaging process, improving yield. When the protrusions are made of metal, the sufficient insulation distance can still be maintained due to the disposing of the additional insulating material layer to cover the protrusions. When the thickness of the extended parts is increased to the same thickness as the base part, in addition to the thicker extended parts to prevent deformation and bending, covering with the insulating material layer can also maintain sufficient insulation distance.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

Figure 12:
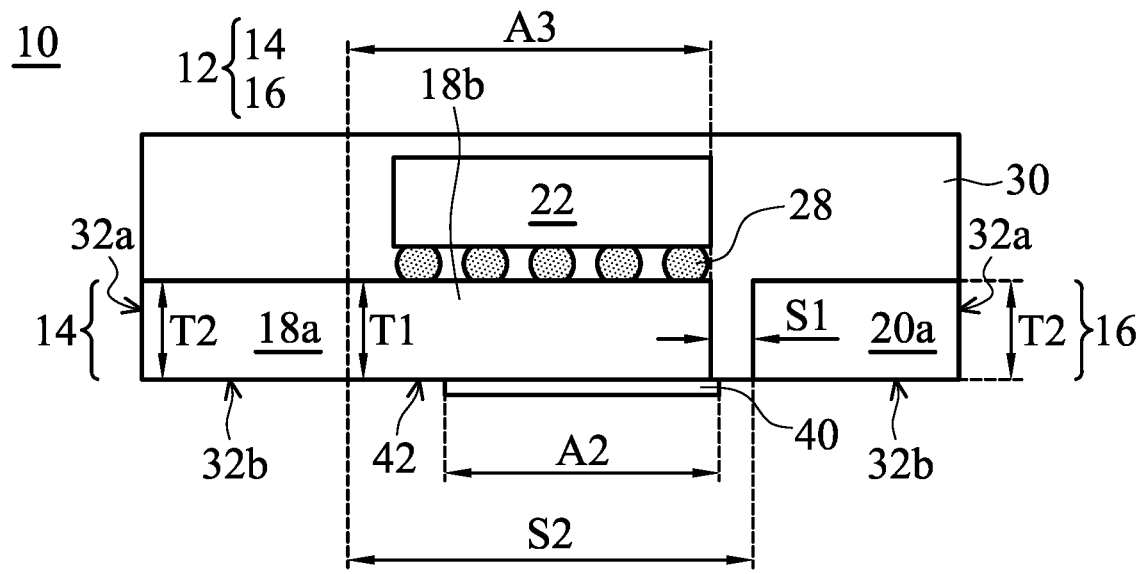
Figure 13:
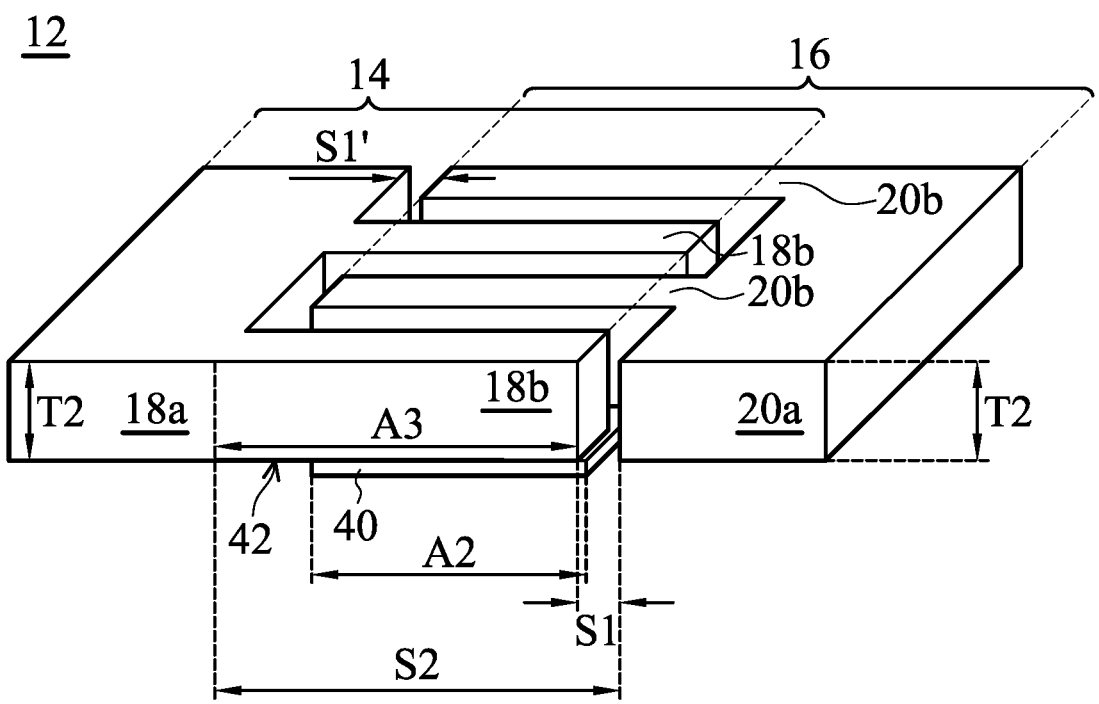

FIG. LI is a stereoscopic view of a leadframe of a package structure in accordance with one embodiment of the invention;

FIG. 12 is a cross-sectional view of a package structure in accordance with one embodiment of the invention; and FIG. 13 is a stereoscopic view of a leadframe of a package structure in accordance with one embodiment of the invention.

DETAILED DESCRIPTION

The following description is of the best-contemplated mode of carrying out the invention. This description is made for the purpose of illustrating the general principles of the invention and should not be taken in a limiting sense. The scope of the invention is determined by reference to the appended claims.

In order to improve the uniformity and stability of current density and voltage of a power component during operation, the invention provides a package structure with a comb-like leadframe. The total cross-sectional area for current conduction can thus be increased by disposing a power component on extended parts protruding from a base part of the comb-like leadframe to achieve uniform and stable current density and voltage during component operation.

Figure 1:
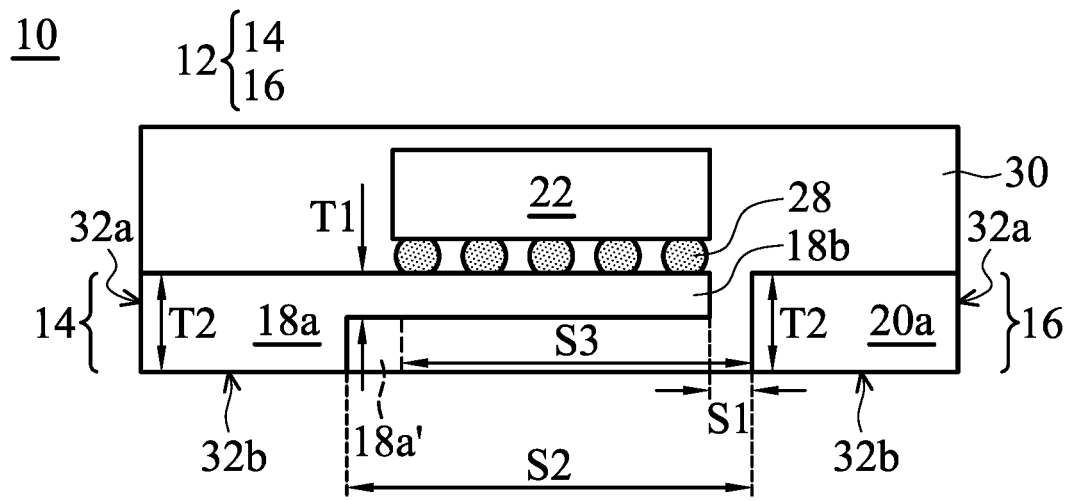
FIG. 1 is a cross-sectional view of a package structure in accordance with one embodiment of the invention.
Figure 2:
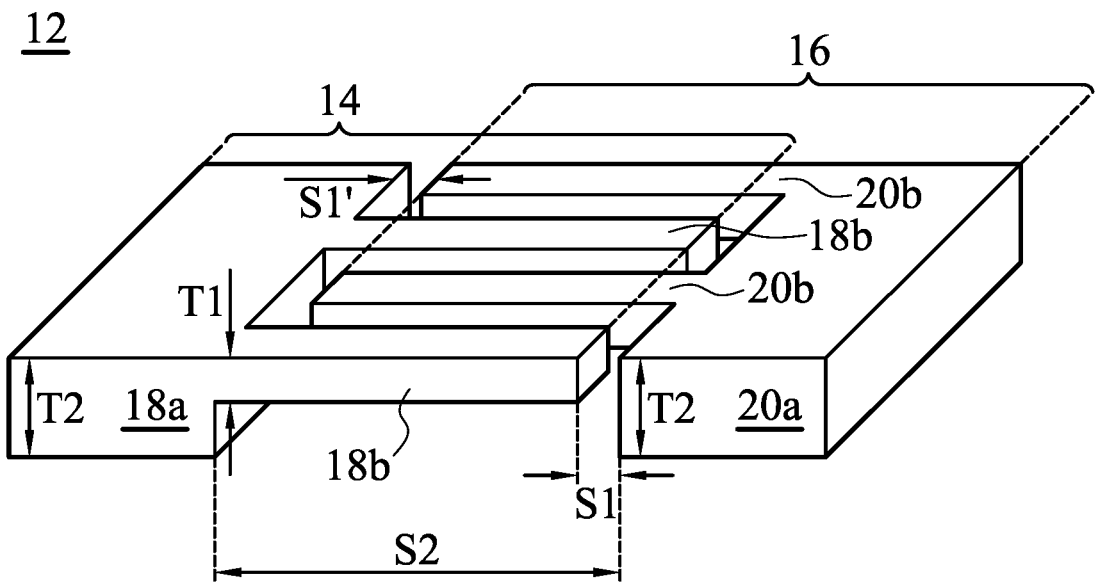
FIG. 2 is a stereoscopic view of a leadframe of a package structure in accordance with one embodiment of the invention.
Figure 3:
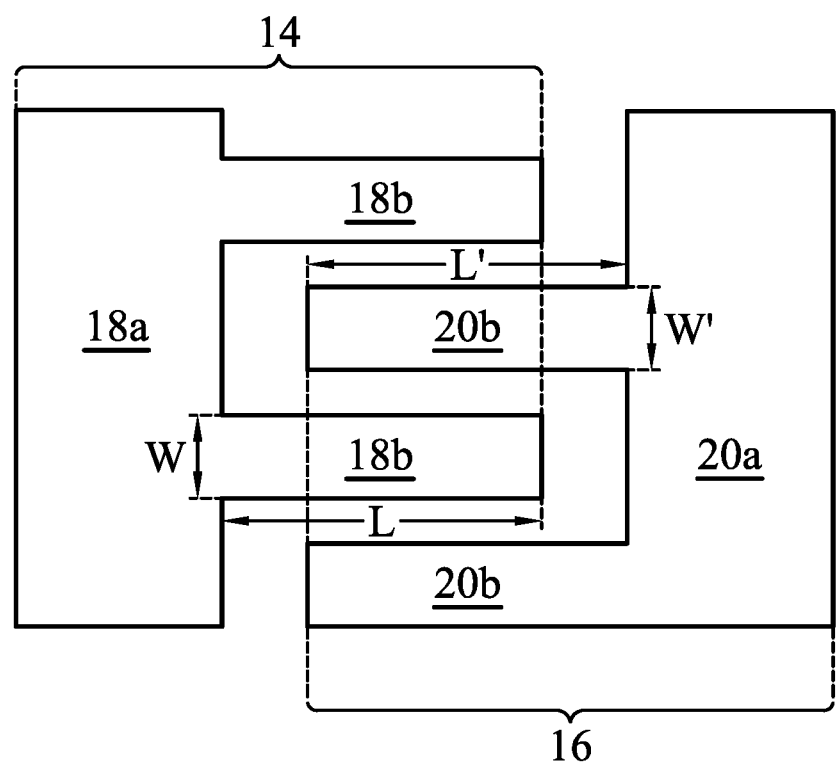
FIG. 3 is a top view of a leadframe of a package structure in accordance with one embodiment of the invention.

Referring to FIGS. 1, 2 and 3, in accordance with one embodiment of the invention, a package structure 10 is provided. FIG. 1 is a cross-sectional view of the package structure 10. FIG. 2 is a stereoscopic view of a leadframe of the package structure 10. FIG. 3 is a top view of a leadframe of the package stricture 10.

As shown in FIGS. 1 and 2, the package structure 10 includes a leadframe 12 including a first portion 14 and a second portion 16 opposite to the first portion 14. The first portion 14 includes a first base part 18a and a plurality of first extended parts 18b, for example two first extended parts 18b, connected to the first base part 18a. The second portion 16 includes a second base part 20a and a plurality of second extended parts 20b, for example two second extended parts 20b, connected to the second base part 20a. In accordance with various product requirements, the number of extended parts may vary in the present invention, for example there may be three, four, or more, as long as there are at least two. The first extended parts 18b and the second extended parts 20b are arranged in such a way that they alternate with each other. In the package structure 10, a chip 22 is disposed on a part of the first extended parts 18b of the first portion 14 and the second extended parts 20b of the second portion 16 of the leadframe 12. In some embodiments, the chip 22 includes power components, for example high-power components.

In some embodiments, the leadframe 12 is made of metal, such as copper or another appropriate metal material. In FIG. 2, the first portion 14 and the second portion 16 are comb-like structures. The first extended parts 18b of the first portion 14 extend towards the second base part 20a of the second portion 16. The second extended parts 20b of the second portion 16 extend towards the first base part 18a of the first portion 14. The first extended parts 18b of the first portion 14 and the second extended parts 20b of the second portion 16 are coplanar.

In FIG. 2, there is a first distance S1 between the first extended part 18b of the first portion 14 and the second base part 20a of the second portion 16. There is a second distance S2 between the first base part 18a of the first portion 14 and the second base part 20a of the second portion 16. In some embodiments, the second distance S2 is greater than or equal to about three times the first distance S1. In some embodiments, the first distance S1 is in a range from about 100 μm to about 500 μm. Similarly, there is a first distance S1' between the second extended part 20b of the second portion 16 and the first base part 18a of the first portion 14. The second distance S2 is greater than or equal to about three times the first distance S1'. In some embodiments, the first distance S1' is in a range from about 100 μm to about 500 μm.

In FIG. 2, the first extended part 18b of the first portion 14 and the second extended part 20b of the second portion 16 have a first thickness T1. The first base part 18a of the first portion 14 and the second base part 20a of the second portion 16 have a second thickness T2. In some embodiments, the second thickness T2 is greater than or equal to about two times the first thickness T1. In some embodiments, the difference between the second thickness T2 and the first thickness T1 is greater than or equal to about 100 μm. In some embodiments, the second thickness T2 is in a range from about 200 μm to about 400 μm.

Referring to FIG. 3, the first extended part 18b has a length L and a width W, and the length L is greater than or equal to about three times the width W. Similarly, the second extended part 20b has a length L' and a width W', and the length L' is greater than or equal to about three times the width W'. In FIG. 3, the first extended part 18b and the second extended part 20b are in the shape of a rectangle.

Figure 4:
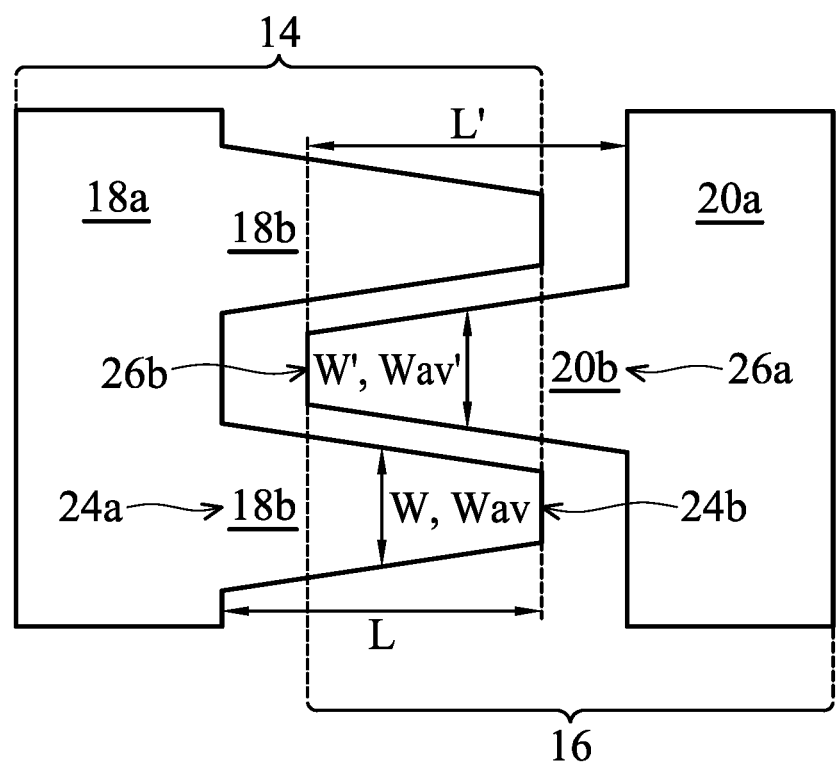
FIG. 4 is a top view of a leadframe of a package structure in accordance with one embodiment of the invention.

In some embodiments, the first extended part 18b and the second extended part 20b being another appropriate shape, such as the shape of trapezoid, is also applicable in the present invention, as shown in FIG. 4. In FIG. 4, the first extended part 18b of the first portion 14 has a bottom portion 24a connected to the first base part 18a and a top portion 24b towards the second base part 20a of the second portion 16. The first extended part 18b has a width W which decreases gradually from the bottom portion 24a to the top portion 24b of the first extended part 18b. The first extended part 18b of the first portion 14 has a length L and an average width Way, and the length L is greater than or equal to about three times the average width Way. Similarly, the second extended part 20b of the second portion 16 has a bottom portion 26a connected to the second base part 20a and a top portion 26b towards the first base part 18a of the first portion 14. The second extended part 20b has a width W' which decreases gradually from the bottom portion 26a to the top portion 26b of the second extended part 20b. The second extended part 20b of the second portion 16 has a length L' and an average width Way', and the length L' is greater than or equal to about three times the average width Way'.

In FIG. 1, the chip 22 is disposed on a part of the first extended parts 18b of the first portion 14 and the second extended parts 20b of the second portion 16 via solder balls 28. In FIG. 1, the solder balls 28 are first formed on the chip 22 by, for example electroplating. The chip 22 is then attached on the first extended parts 18b of the first portion 14 and the second extended parts 20b of the second portion 16 by the solder balls 28 using the flip chip technology.

In FIG. 1, in some embodiments, a part of the first base part 18a of the first portion 14 further extends towards the second base part 20a of the second portion 16 to form an extending portion 18a' which is under a part of the first extended part 18b of the first portion 14. In FIG. 1, there is a third distance S3 between the extending portion 18a' of the first base part 18a of the first portion 14 and the second base part 20a of the second portion 16. In some embodiments, the third distance S3 is greater than or equal to about three times the first distance S1.

In FIG. 1, the package structure 10 further includes an encapsulation material 30 covering the chip 22 and a part of the leadframe 12, exposing sidewalls 32a and bottoms 32b of the first base part 18a of the first portion 14 and the second base part 20a of the second portion 16 of the leadframe 12.

Figure 5:
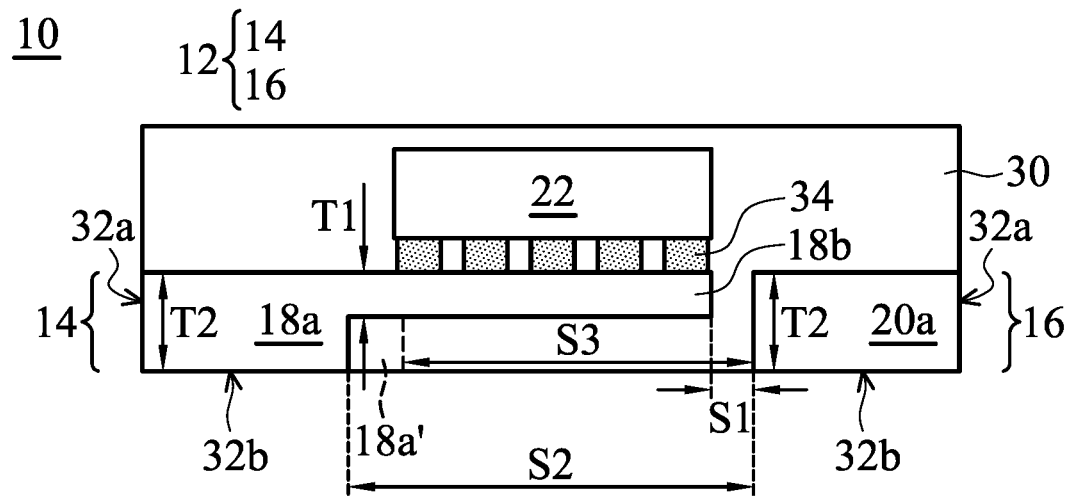
FIG. 5 is a cross-sectional view of a package structure in accordance with one embodiment of the invention.

Referring to FIGS. 5, 2 and 3, in accordance with one embodiment of the invention, a package structure 10 is provided. FIG. 5 is a cross-sectional view of the package structure 10. FIG. 2 is a stereoscopic view of a leadframe of the package structure 10. FIG. 3 is a top view of a leadframe of the package structure 10.

As shown in FIGS. 5 and 2, the package structure 10 includes a leadframe 12 including a first portion 14 and a second portion 16 opposite to the first portion 14. The first portion 14 includes a first base part 18a and a plurality of first extended parts 18b, for example two first extended parts 18b, connected to the first base part 18a. The second portion 16 includes a second base part 20a and a plurality of second extended parts 20b, for example two second extended parts 20b, connected to the second base part 20a. In accordance with various product requirements, the number of extended parts may vary in the present invention, for example there may be three, four, or more, as long as there are at least two. The first extended parts 18b and the second extended parts 20b are arranged in such a way that they alternate with each other. In the package structure 10, a chip 22 is disposed on a part of the first extended parts 18b of the first portion 14 and the second extended parts 20b of the second portion 16 of the leadframe 12. In some embodiments, the chip 22 includes power components, for example high-power components.

In some embodiments, the leadframe 12 is made of metal, such as copper or another appropriate metal material. In FIG. 2, the first portion 14 and the second portion 16 are comb-like structures. The first extended parts 18b of the first portion 14 extend towards the second base part 20a of the second portion 16. The second extended parts 20b of the second portion 16 extend towards the first base part 18a of the first portion 14. The first extended parts 18b of the first portion 14 and the second extended parts 20b of the second portion 16 are coplanar.

In FIG. 2, there is a first distance S1 between the first extended part 18b of the first portion 14 and the second base part 20a of the second portion 16. There is a second distance S2 between the first base part 18a of the first portion 14 and the second base part 20a of the second portion 16. In some embodiments, the second distance S2 is greater than or equal to about three times the first distance S1. In some embodiments, the first distance S1 is in a range from about 100 μm to about 500 μm. Similarly, there is a first distance S1' between the second extended part 20b of the second portion 16 and the first base part 18a of the first portion 14. The second distance S2 is greater than or equal to about three times the first distance S1'. In some embodiments, the first distance S1' is in a range from about 100 μm to about 500 μm.

In FIG. 2, the first extended part 18b of the first portion 14 and the second extended part 20b of the second portion 16 have a first thickness T1. The first base part 18a of the first portion 14 and the second base part 20a of the second portion 16 have a second thickness T2. In some embodiments, the second thickness T2 is greater than or equal to about two times the first thickness T1. In some embodiments, the difference between the second thickness T2 and the first thickness T1 is greater than or equal to about 100 μm. In some embodiments, the second thickness T2 is in a range from about 200 μm to about 400 μm.

Referring to FIG. 3, the first extended part 18b has a length L and a width W, and the length L is greater than or equal to about three times the width W. Similarly, the second extended part 20b has a length L' and a width W', and the length L' is greater than or equal to about three times the width W'. In FIG. 3, the first extended part 18b and the second extended part 20b are in the shape of a rectangle.

In some embodiments, the first extended park 18b and the second extended part 20b being another appropriate shape, such as the shape of trapezoid, is also applicable in the present invention, as shown in FIG. 4. In FIG. 4, the first extended park 18b of the first portion 14 has a bottom portion 24a connected to the first base part 18a and a top portion 24b towards the second base part 20a of the second portion 16. The first extended part 18b has a width W which decreases gradually from the bottom portion 24a to the top portion 24b of the first extended part 18b. The first extended part 18b of the first portion 14 has a length L and an average width Way, and the length L is greater or equal to about three times the average width Way. Similarly, the second extended part 20b of the second portion 16 has a bottom portion 26a connected to the second base part 20a and a top portion 26b towards the first base part 18a of the first portion 14. The second extended part 20b has a width W' which decreases gradually from the bottom portion 26a to the top portion 26b of the second extended part 20b. The second extended part 20b of the second portion 16 has a length L' and an average width Way', and the length L' is greater than or equal to about three times the average width Way'.

In FIG. 5, the chip 22 is disposed on a part of the first extended parts 18b of the first portion 14 and the second extended parts 20b of the second portion 16 via copper pillars 34. In FIG. 5, the copper pillars 34 are first formed on the chip 22 by, for example electroplating. The chip 22 is then attached on the first extended parts 18b of the first portion 14 and the second extended parts 20b of the second portion 16 by the copper pillars 34 using the flip chip technology.

In FIG. 5, in some embodiments, a part of the first base part 18a of the first portion 14 further extends towards the second base part 20a of the second portion 16 to form an extending portion 18a' which is under a part of the first extended part 18b of the first portion 14. In FIG. 5, there is a third distance S3 between the extending portion 18a' of the first base part 18a of the first portion 14 and the second base part 20a of the second portion 16. In some embodiments, the third distance S3 is greater than or equal to about three times the first distance S1.

In FIG. 5, the package structure 10 further includes an encapsulation material 30 covering the chip 22 and a part of the leadframe 12, exposing sidewalls 32a and bottoms 32b of the first base part 18a of the first portion 14 and the second base part 20a of the second portion 16 of the leadframe 12.

Figure 6:
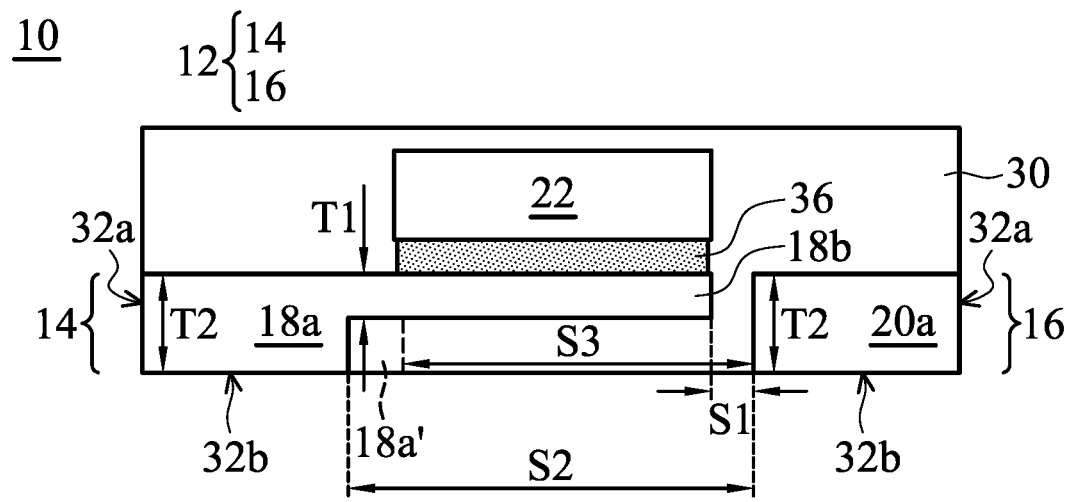
FIG. 6 is a cross-sectional view of a package structure in accordance with one embodiment of the invention.

Referring to FIGS. 6, 2 and 3, in accordance with one embodiment of the invention, a package structure 10 is provided. FIG. 6 is a cross-sectional view of the package structure 10. FIG. 2 is a stereoscopic view of a leadframe of the package structure 10. FIG. 3 is a top view of a leadframe of the package structure 10.

As shown in FIGS. 6 and 2, the package structure 10 includes a leadframe 12 including a first portion 14 and a second portion 16 opposite to the first portion 14. The first portion 14 includes a first base part 18a and a plurality of first extended parts 18b, for example two first extended parts 18b, connected to the first base part 18a. The second portion 16 includes a second base part 20a and a plurality of second extended parts 20b, for example two second extended parts 20b, connected to the second base part 20a. In accordance with various product requirements, the number of extended parts may vary in the present invention, for example there may be three, four, or more, as long as there are at least two. The first extended parts 18b and the second extended parts 20b are arranged in such a way that they alternate with each other. In the package structure 10, a chip 22 is disposed on a part of the first extended parts 18b of the first portion 14 and the second extended parts 20b of the second portion 16 of the leadframe 12. In some embodiments, the chip 22 includes power components, for example high-power components.

In some embodiments, the leadframe 12 is made of metal, such as copper or another appropriate metal material. In FIG. 2, the first portion 14 and the second portion 16 are comb-like structures. The first extended parts 18b of the first portion 14 extend towards the second base part 20a of the second portion 16. The second extended parts 20b of the second portion 16 extend towards the first base part 18a of the first portion 14. The first extended parts 18b of the first portion 14 and the second extended parts 20b of the second portion 16 are coplanar.

In FIG. 2, there is a first distance S1 between the first extended part 18b of the first portion 14 and the second base part 20a of the second portion 16. There is a second distance S2 between the first base part 18a of the first portion 14 and the second base part 20a of the second portion 16. In some embodiments, the second distance S2 is greater than or equal to about three times the first distance S1. In some embodiments, the first distance S1 is in a range from about 100 μm to about 500 μm. Similarly, there is a first distance S1' between the second extended part 20b of the second portion 16 and the first base part 18a of the first portion 14. The second distance S2 is greater than or equal to about three times the first distance S1'. In some embodiments, the first distance S1' is in a range from about 100 μm to about 500 μm.

In FIG. 2, the first extended part 18b of the first portion 14 and the second extended part 20b of the second portion 16 have a first thickness T1. The first base part 18a of the first portion 14 and the second base part 20a of the second portion 16 have a second thickness T2. In some embodiments, the second thickness T2 is greater than or equal to about two times the first thickness T1. In some embodiments, the difference between the second thickness T2 and the first thickness T1 is greater than or equal to about 100 μm. In some embodiments, the second thickness T2 is in a range from about 200 μm to about 400 μm.

Referring to FIG. 3, the first extended part 18b has a length L and a width W, and the length L is greater than or equal to about three times the width W. Similarly, the second extended part 20b has a length L' and a width W', and the length L' is greater than or equal to about three times the width W'. In FIG. 3, the first extended part 18b and the second extended part 20b are in the shape of a rectangle.

In some embodiments, the first extended part 18b and the second extended part 20b being another appropriate shape, such as the shape of trapezoid, is also applicable in the present invention, as shown in FIG. 4. In FIG. 4, the first extended part 18b of the first portion 14 has a bottom portion 24a connected to the first base part 18a and a top portion 24b towards the second base part 20a of the second portion 16. The first extended part 18b has a width W which decreases gradually from the bottom portion 24a to the top portion 24b of the first extended part 18b. The first extended part 18b of the first portion 14 has a length L and an average width Way, and the length L is greater than or equal to about three times the average width Way. Similarly, the second extended part 20b of the second portion 16 has a bottom portion 26a connected to the second base part 20a and a top portion 26b towards the first base part 18a of the first portion 14. The second extended part 20b has a width W' which decreases gradually from the bottom portion 26a to the top portion 26b of the second extended part 20b. The second extended part 20b of the second portion 16 has a length L' and an average width Way', and the length L' is greater than or equal to about three times the average width Way'.

In FIG. 6, the chip 22 is disposed on a part of the first extended parts 18b of the first portion 14 and the second extended parts 20b of the second portion 16 via solder paste 36. In FIG. 6, the solder paste 36 is first formed on the first extended parts 18b of the first portion 14 and the second extended parts 20b of the second portion 16 by, for example screen printing. The chip 22 is then attached on the first extended parts 18b of the first portion 14 and the second extended parts 20b of the second portion 16 by the solder paste 36 using the flip chip technology. In some embodiments, other appropriate conductive materials, such as silver paste, are also applicable in the present invention.

In FIG. 6, in some embodiments, a part of the first base part 18a of the first portion 14 further extends towards the second base part 20a of the second portion 16 to form an extending portion 18a' which is under a part of the first extended part 18b of the first portion 14. In FIG. 6, there is a third distance S3 between the extending portion 18a' of the first base part 18a of the first portion 14 and the second base part 20a of the second portion 16. In some embodiments, the third distance S3 is greater than or equal to about three times the first distance S1.

In FIG. 6, the package structure 10 further includes an encapsulation material 30 covering the chip 22 and a part of the leadframe 12, exposing sidewalls 32a and bottoms 32b of the first base part 18a of the first portion 14 and the second base part 20a of the second portion 16 of the leadframe 12.

Figure 7:
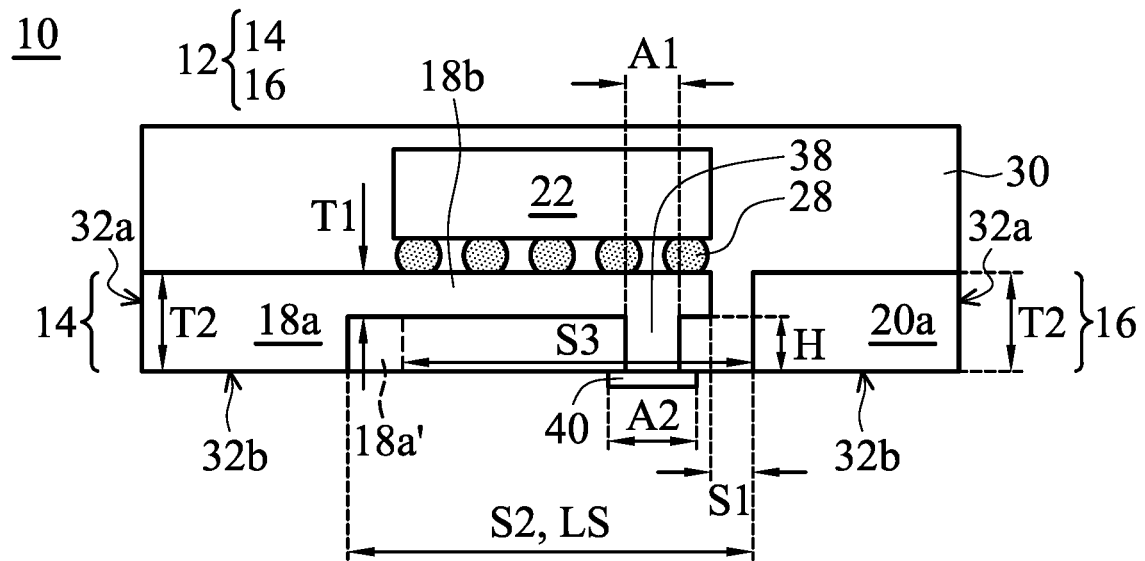
FIG. 7 is a cross-sectional view of a package structure in accordance with one embodiment of the invention.
Figure 8:
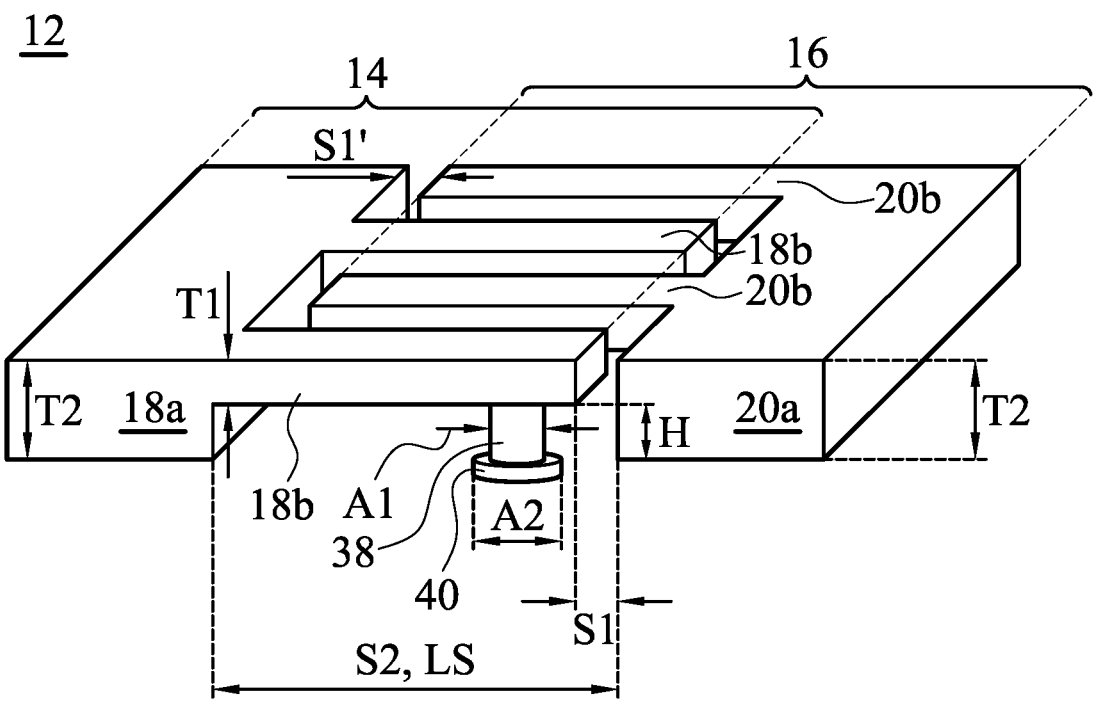
FIG. 8 is a stereoscopic view of a leadframe of a package structure in accordance with one embodiment of the invention.

Referring to FIGS. 7 and 8, in accordance with one embodiment of the invention, a package structure 10 is provided. FIG. 7 is a cross-sectional view of the package structure 10. FIG. 8 is a stereoscopic view of a leadframe of the package structure 10.

As shown in FIGS. 7 and 8, the package structure 10 includes a leadframe 12 including a first portion 14 and a second portion 16 opposite to the first portion 14. The first portion 14 includes a first base part 18a and a plurality of first extended parts 18b, for example two first extended parts 18b, connected to the first base part 18a. The second portion 16 includes a second base part 20a and a plurality of second extended parts 20b, for example two second extended parts 20b, connected to the second base part 20a. In accordance various product requirements, the number of extended parts may vary in the present invention, for example there may be three, four, or more, as long as there are at least two. The first extended parts 18b and the second extended parts 20b are arranged in such a way that they alternate with each other. In the package structure 10, a chip 22 is disposed on a part of the first extended parts 18b of the first portion 14 and the second extended parts 20b of the second portion 16 of the leadframe 12. In some embodiments, the chip 22 includes power components, for example high-power components. The package structure 10 further includes a plurality of protrusions 38, opposite to the chip 22, disposed on the first extended parts 18b and the second extended parts 20b. Each of the first extended parts 18b and the second extended parts 20b has at least one protrusion 38 disposed thereon. In accordance with various product requirements (i.e. various lengths of the extended parts), the number of protrusions may vary in the present invention, for example there may be two, three, or more on each of the extended parts, as long as there are at least one.

In some embodiments, the leadframe 12 is made of metal, such as copper or another appropriate metal material. In FIG. 8, the first portion 14 and the second portion 16 are comb-like structures. The first extended parts 18b of the first portion 14 extend towards the second base part 20a of the second portion 16. The second extended parts 20b of the second portion 16 extend towards the first base part 18a of the first portion 14. The first extended parts 18b of the first portion 14 and the second extended parts 20b of the second portion 16 are coplanar.

In FIG. 8, there is a first distance S1 between the first extended part 18b of the first portion 14 and the second base part 20a of the second portion 16. There is a second distance S2 between the first base part 18a of the first portion 14 and the second base part 20a of the second portion 16. In some embodiments, the second distance S2 is greater than or equal to about three times the first distance S1. In some embodiments, the first distance S1 is in a range from about 100 μm to about 500 μm. Similarly, there is a first distance S1' between the second extended part 20b of the second portion 16 and the first base part 18a of the first portion 14. In some embodiments, the second distance S2 is greater than or equal to about three times the first distance S1'. In some embodiments, the first distance S1' is in a range from about 100 μm to about 500 μm.

In FIG. 8, the first extended part 18b of the first portion 14 and the second extended part 20b of the second portion 16 have a first thickness T1. The first base part 18a of the first portion 14 and the second base part 20a of the second portion 16 have a second thickness T2. In some embodiments, the second thickness T2 is greater than or equal to about two times the first thickness T1. In some embodiments, the difference between the second thickness T2 and the first thickness T1 is greater than or equal to about 100 μm. In some embodiments, the second thickness T2 is in a range from about 200 μm to about 400 μm.

The dimensions and shapes of the first extended parts 18b and the second extended parts 20b are similar to FIGS. 3 and 4.

In FIG. 7, the chip 22 is disposed on a part of the first extended parts 18b of the first portion 14 and the second extended parts 20b of the second portion 16 via solder balls 28. In FIG. 7, the solder balls 28 are first formed on the chip 22 by, for example electroplating. The chip 22 is then attached on the first extended parts 18b of the first portion 14 and the second extended parts 20b of the second portion 16 by the solder balls 28 using the flip chip technology.

In FIG. 7, in some embodiments, a part of the first base part 18a of the first portion 14 further extends towards the second base part 20a of the second portion 16 to form an extending portion 18a' which is under a part of the first extended part 18b of the first portion 14. In FIG. 7, there is a third distance S3 between the extending portion 18a' of the first base part 18a of the first portion 14 and the second base part 20a of the second portion 16. In some embodiments, the third distance S3 is greater than or equal to about three times the first distance S1.

In FIG. 7, the package structure 10 further includes an encapsulation material 30 covering the chip 22 and a part of the leadframe 12, exposing sidewalls 32a and bottoms 32b of the first base part 18a of the first portion 14 and the second base part 20a of the second portion 16 of the leadframe 12.

In FIGS. 7 and 8, the protrusions 38 are cylinders and made of metal. The protrusions 38 have a height H that is the second thickness T2 minus the first thickness T1. The protrusions 38, the first base part 18a and the second base part 20a are coplanar and exposed from the encapsulation material 30. The package structure 10 further includes an insulating material layer 40 covering the protrusions 38. The protrusions 38 have an exposed area A1 from the encapsulation material 30. The insulating material layer 40 has an area A2. In some embodiments, the area A2 of the insulating material layer 40 is greater than or equal to the exposed area A1 of the protrusions 38. In some embodiments, one of the first extended parts 18b and one of the protrusions 38 are formed as one single piece, and one of the second extended parts 20b and one of the protrusions 38 are formed as one single piece.

In FIGS. 7 and 8, a distance LS between the first base part 18a of the first portion 14 and the second base part 20a of the second portion 16 is defined as an insulation distance. The insulation distance LS can be maintained due to the disposing of the insulating material layer 40 on the protrusions 38.

Figure 9:
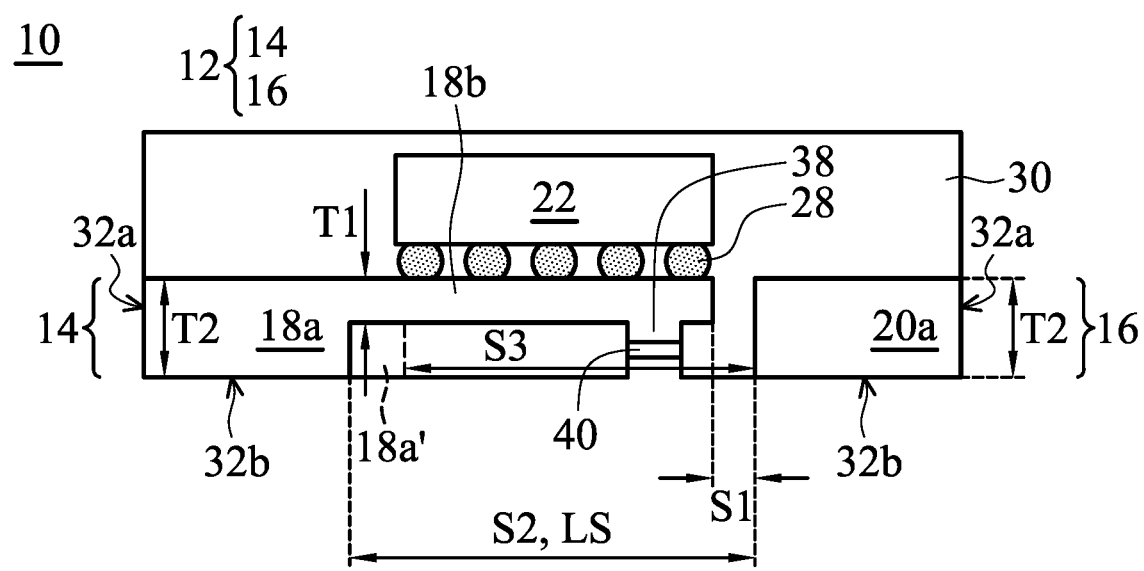
FIG. 9 is a cross-sectional view of a package structure in accordance with one embodiment of the invention.

Referring to FIG. 9, in accordance with one embodiment of the invention, a package structure 10 is provided. FIG. 9 is a cross-sectional view of the package structure 10.

The embodiment of FIG. 9 is similar to that of FIG. 7. The distinction therebetween is that, in FIG. 9, the protrusions 38 and the insulating material layer 40 are buried in the encapsulation material 30. In addition to having a better appearance, the buried insulating material layer 40 can also avoid collision and abrasion.

Figure 10:
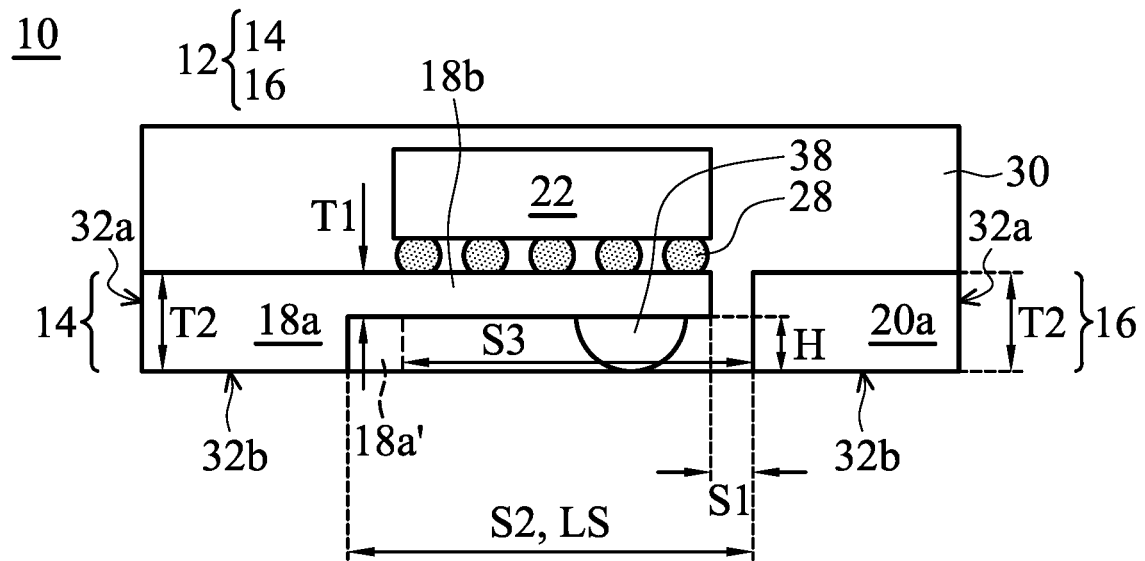
FIG. 10 is a cross-sectional view of a package structure in accordance with one embodiment of the invention.
Figure 11:
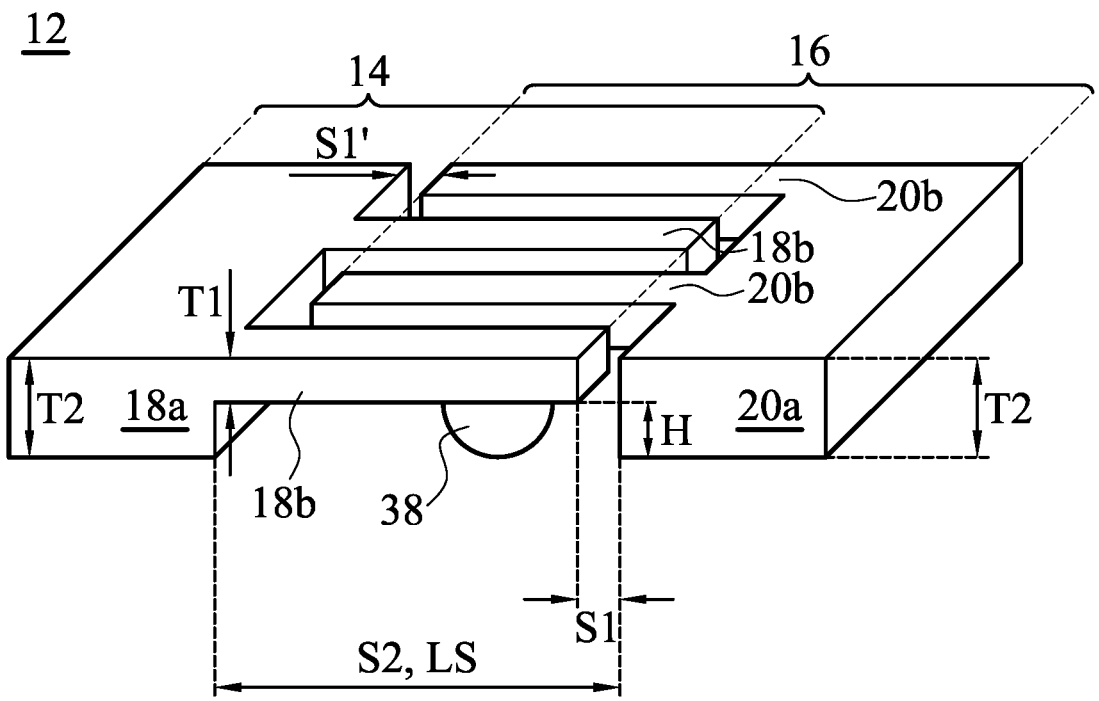

Referring to FIGS. 10 and 11, in accordance with one embodiment of the invention, a package structure 10 is provided. FIG. 10 is a cross-sectional view of the package structure 10. FIG. 11 is a stereoscopic view of a leadframe of the package structure 10.

The embodiment of FIGS. 10 and 11 is similar to that of FIGS. 7 and 8. The distinction therebetween is that, in FIGS. 10 and 11, the protrusions 38 are made of insulating material, and no insulating material layer is utilized to cover the protrusions 38.

Referring to FIGS. 12 and 13, in accordance with one embodiment of the invention, a package structure 10 is provided. FIG. 12 is a cross-sectional view of the package structure 10. FIG. 13 is a stereoscopic view of a leadframe of the package structure 10.

As shown in FIGS. 12 and 13, the package structure 10 includes a leadframe 12 including a first portion 14 and a second portion 16 opposite to the first portion 14. The first portion 14 includes a first base part 18a and a plurality of first extended parts 18b, for example two first extended parts 18b connected to the first base part 18a. The second portion 16 includes a second base part 20a and a plurality of second extended parts 20b, for example two second extended parts 20b, connected to the second base part 20a. In accordance with various product requirements, the number of extended parts may vary in the present invention, for example there may be three, four, or more, as long as there are at least two. The first extended parts 18b and the second extended parts 20b are arranged in such a way that they alternate with each other. The first extended part 18b of the first portion 14 and the second extended part 20b of the second portion 16 have a first thickness T1. The first base part 18a of the first portion 14 and the second base part 20a of the second portion 16 have a second thickness T2. Specifically, the second thickness T2 is equal to the first thickness T1. In some embodiments, the second thickness T2 and the first thickness T1 are in a range from about 200 µm to about 400 µm. In the package structure 10, a chip 22 is disposed on a part of the first extended parts 18b of the first portion 14 and the second extended parts 20b of the second portion 16 of the leadframe 12. In some embodiments, the chip 22 includes power components, for example high-power components.

In some embodiments, the leadframe 12 is made of metal, such as copper or another appropriate metal material. In FIG. 13, the first portion 14 and the second portion 16 are comb-like structures. The first extended parts 18b of the first portion 14 extend towards the second base part 20a of the second portion 16. The second extended parts 20b of the second portion 16 extend towards the first base part 18a of the first portion 14. The first extended parts 18b of the first portion 14 and the second extended parts 20b of the second portion 16 are coplanar.

In FIG. 13, there is a first distance S1 between the first extended part 18b of the first portion 14 and the second base part 20a of the second portion 16. There is a second distance S2 between the first base part 18a of the first portion 14 and the second base part 20a of the second portion 16. In some embodiments, the second distance S2 is greater than or equal to about three times the first distance S1. In some embodiments, the first distance S1 is in a range from about 100 µm to about 500 µm. Similarly, there is a first distance S1' between the second extended part 20b of the second portion 16 and the first base part 18a of the first portion 14. In some embodiments, the second distance S2 is greater than or equal to about three times the first distance S1'. In some embodiments, the first distance S1' is in a range from about 100 µm to about 500 µm.

The dimensions and shapes of the first extended parts 18b and the second extended parts 20b are similar to FIGS. 3 and 4.

In FIG. 12, the chip 22 is disposed on a part of the first extended parts 18b of the first portion 14 and the second extended parts 20b of the second portion 16 via solder balls 28. In FIG. 12, the solder balls 28 are first formed on the chip 22 by, for example electroplating. The chip 22 is then attached on the first extended parts 18b of the first portion 14 and the second extended parts 20b of the second portion 16 by the solder balls 28 using the flip chip technology.

In FIG. 12, the package structure 10 further includes an encapsulation material 30 covering the chip 22 and a part of the leadframe 12, exposing sidewalls 32a and bottoms 32b of the first base part 18a of the first portion 14 and the second base part 20a of the second portion 16 and bottoms 42 of the first extended parts 18b of the first portion 14 and the second extended parts 20b of the second portion 16 of the leadframe 12.

In FIGS. 12 and 13, the first extended parts 18b, the first base part 18a, the second extended parts 20b and the second base part 20a are coplanar and exposed from the encapsulation material 30. The package structure 10 further includes an insulating material layer 40 covering the exposed first extended parts 18b and second extended parts 20b. The first extended parts 18b and the second extended parts 20b have an exposed area A3 from the encapsulation material 30. The insulating material layer 40 has an area A2. In some embodiments, the area A2 of the insulating material layer 40 is less than or equal to the exposed area A3 of the first extended parts 18b and the second extended parts 20b. In accordance with various product requirements (i.e. various required insulation distances), the area of insulating material layer may vary in the present invention, for example there may be less than, equal to or greater than the exposed area of the first extended parts and the second extended parts.

In the present invention, a package structure with a specific comb-like leadframe is provided. Some appropriate dimensions and structure configurations of the leadframe are considered. For example, the distance between the first base part and the second base part is greater than or equal to about three times the distance between the first extended part and the second base part, or the thickness of the base part is greater than or equal to about two times the thickness of the extended part, or the extended part has the shape of trapezoid. When the distance between the first extended part and the second base part is less than 100 μm, the insulation distance is insufficient. When the distance between the first extended part and the second base part is greater than 500 μm, the size of the chip will exceed the range of the extended part, affecting the current conduction. When the thickness of the extended part is too thick, there is a risk of exposing the extended parts from the encapsulation material. In addition, the trapezoidal extended part improves the uniformity of the current conduction. When current is collected along the chip, it is no longer conducted only through the metal structure in the chip, but is the "extended part" combined with the metal structure. The total cross-sectional area for current conduction is increased by disposing the chip on the extended parts protruding from the base part of the comb-like leadframe which further increases the carrying current. The increase of the cross-sectional area also reduces the resistance value simultaneously, so that when the current flows through it, the voltage difference generated is reduced, achieving uniform and stable current density and voltage during component operation.

In the present invention, the extended parts of the leadframe are further supported by the protrusions made of metal or insulating material, which can avoid deformation and bending of the extended parts during the packaging process, improving yield. When the protrusions are made of metal, the sufficient insulation distance can still be maintained due to the disposing of the additional insulating material layer to cover the protrusions. When the thickness of the extended parts is increased to the same thickness as the base part, in addition to the thicker extended parts to prevent deformation and bending, covering with the insulating material layer can also maintain sufficient insulation distance.

While the invention has been described by way of example and in terms of embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure, comprising:
   a leadframe comprising a first portion and a second portion opposite to the first portion, wherein the first portion comprises a first base part and a plurality of first extended parts connected to the first base part, the second portion comprises a second base part and a plurality of second extended parts connected to the second base part, and the first extended parts and the second extended parts are arranged in such a way that they alternate with each other as seen in a plan view;
   a chip disposed on a part of the first extended parts of the first portion and the second extended parts of the second portion of the leadframe; and
   a plurality of protrusions, opposite to the chip, disposed on the first extended parts and the second extended parts, wherein each of the first extended parts and the second extended parts has at least one protrusion disposed thereon.

2. The package structure as claimed in claim 1, wherein there is a first distance between the first extended part of the first portion and the second base part of the second portion.

3. The package structure as claimed in claim 2, wherein there is a second distance between the first base part of the first portion and the second base part of the second portion.

4. The package structure as claimed in claim 3, wherein the second distance is greater than or equal to three times the first distance.

5. The package structure as claimed in claim 1, wherein the first extended part of the first portion and the second extended part of the second portion have a first thickness.

6. The package structure as claimed in claim 5, wherein the first base part of the first portion and the second base part of the second portion have a second thickness.

7. The package structure as claimed in claim 6, wherein the second thickness is greater than or equal to two times the first thickness.

8. The package structure as claimed in claim 7, wherein a difference between the second thickness and the first thickness is greater than or equal to 100 μm.

9. The package structure as claimed in claim 6, wherein the second thickness is in a range from 200 μm to 400 μm.

10. The package structure as claimed in claim 1, wherein the first extended part of the first portion has a bottom portion connected to the first base part and a top portion towards the second base part of the second portion, and the first extended part has a width which decreases gradually from the bottom portion to the top portion of the first extended part.

11. The package structure as claimed in claim 1, wherein the chip is disposed on a part of the first extended parts of the first portion and the second extended parts of the second portion via solder balls.

12. The package structure as claimed in claim 1, wherein the chip is disposed on a part of the first extended parts of the first portion and the second extended parts of the second portion via copper pillars.

13. The package structure as claimed in claim 1, wherein the chip is disposed on a part of the first extended parts of the first portion and the second extended parts of the second portion via solder paste, silver paste or a solder bar.

14. The package structure as claimed in claim 1, further comprising an encapsulation material covering the chip and a part of the leadframe, exposing sidewalls and bottoms of the first base part of the first portion and the second base part of the second portion of the leadframe.

15. The package structure as claimed in claim 14, wherein the protrusions are made of metal or an insulating material.

16. The package structure as claimed in claim 15, wherein the protrusions, the first base part and the second base part are coplanar and exposed from the encapsulation material.

17. The package structure as claimed in claim 16, further comprising an insulating material layer covering the protrusions, when the protrusions are made of metal.

18. The package structure as claimed in claim 15, further comprising an insulating material layer covering the protrusions, when the protrusions are made of metal, wherein the protrusions and the insulating material layer are buried in the encapsulation material.

19. The package structure as claimed in claim 1, wherein the first extended parts and the second extended parts have a first thickness, the first base part and the second base part have a second thickness, and the second thickness is the same as the first thickness.

20. The package structure as claimed in claim 1, wherein one of the first extended parts and one of the protrusions are formed as one single piece, and one of the second extended parts and one of the protrusions are formed as one single piece.

* * * * *